(12) United States Patent
Holmes et al.

(10) Patent No.: US 8,569,168 B2
(45) Date of Patent: Oct. 29, 2013

(54) DUAL-METAL SELF-ALIGNED WIRES AND VIAS

(75) Inventors: Steven J. Holmes, Guilderland, NY (US); David V. Horak, Essex Junction, VT (US); Charles W. Koburger, III, Delmar, NY (US); Shom Ponoth, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/371,493

(22) Filed: Feb. 13, 2012

(65) Prior Publication Data

US 2013/0207270 A1   Aug. 15, 2013

(51) Int. Cl.
*H01L 21/44* (2006.01)

(52) U.S. Cl.
USPC ........... 438/652; 438/669; 438/734; 438/742; 257/210; 257/211; 257/E21.626; 257/E21.627; 257/E29.152; 216/8; 216/11; 216/13; 216/39

(58) Field of Classification Search
None
See application file for complete search history.

(56) References Cited

U.S. PATENT DOCUMENTS

| | | | |
|---|---|---|---|
| 5,466,636 A | 11/1995 | Cronin et al. | |
| 5,840,625 A | 11/1998 | Feldner | |
| 6,020,255 A | 2/2000 | Tsai et al. | |
| 6,420,099 B1 | 7/2002 | Gutsche et al. | |
| 6,440,870 B1 | 8/2002 | Nallan et al. | |
| 6,534,866 B1 | 3/2003 | Trivedi et al. | |

OTHER PUBLICATIONS

M. Moussavi, "Advanced Conventional Interconnects: State of the Art, Future Trends, and Limitations," Springer Series in Optical Sciences, vol. 119, 2006, pp. 1-13.

S. G. Bombardier et al., "Aluminum-Tungsten-Aluminum Sandwich for Semiconductor Chip Wirebond Pad", IBM Technical Disclosure Bulletin, vol. 40, No. 6, Jun. 1997, p. 131.

*Primary Examiner* — Yasser Abdelaziez
(74) *Attorney, Agent, or Firm* — Ira D. Blecker; Katherine S. Brown

(57) ABSTRACT

Method of forming a semiconductor structure which includes forming first conductive spacers on a semiconductor substrate; forming second conductive spacers with respect to the first conductive spacers, at least one of the second conductive spacers adjacent to and in contact with each of the first conductive spacers to form combined conductive spacers; recessing the second conductive spacers with respect to the first conductive spacers so that the first conductive spacers extend beyond the second conductive spacers; depositing an ILD to cover the first and second spacers except for an exposed edge of the first conductive spacers; patterning the exposed edges of the first conductive spacers to recess the edges of the first conductive spacers in predetermined locations to form recesses with respect to the ILD; and filling the recesses with an insulating material to leave unrecessed edges of the first conductive spacers as vias to subsequent wiring features.

18 Claims, 13 Drawing Sheets

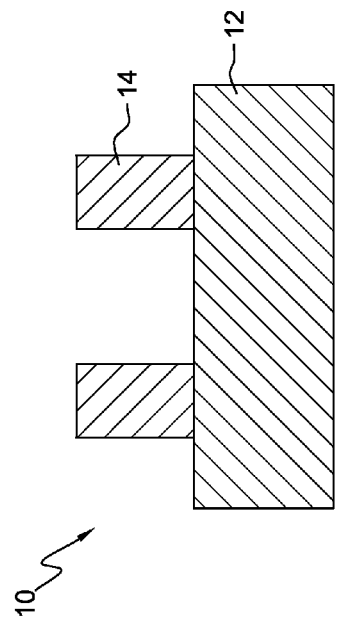
FIG. 1A
FIG. 1B
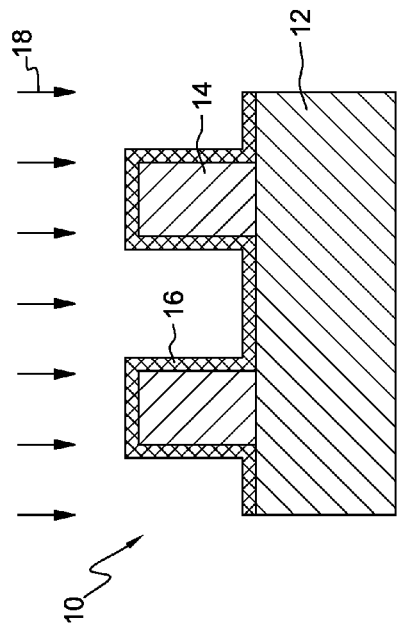
FIG. 2A
FIG. 2B

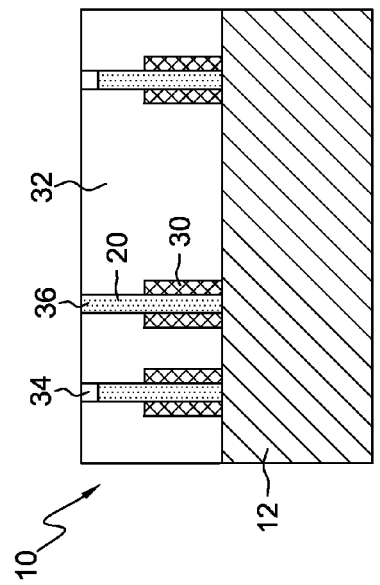
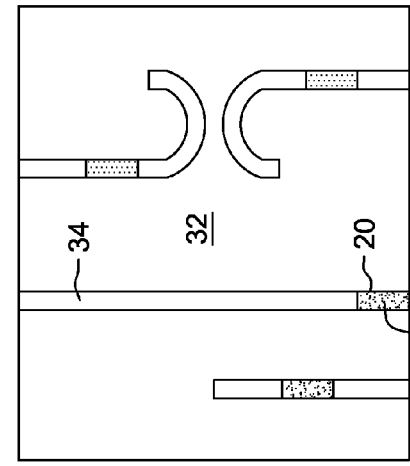
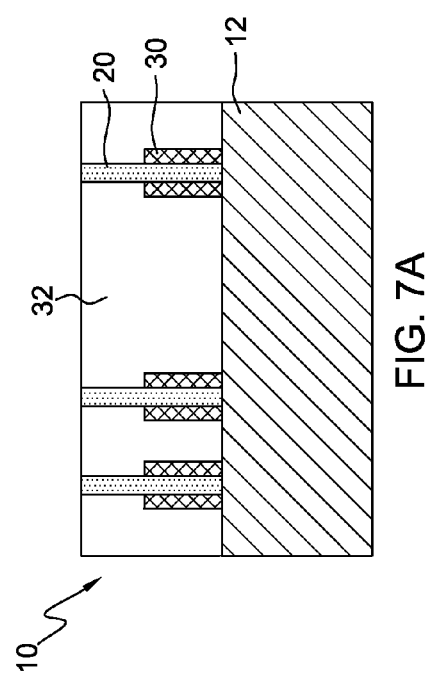
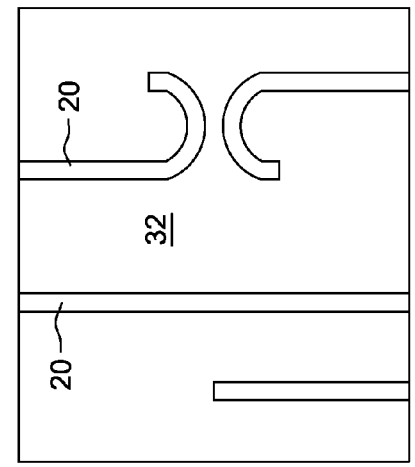

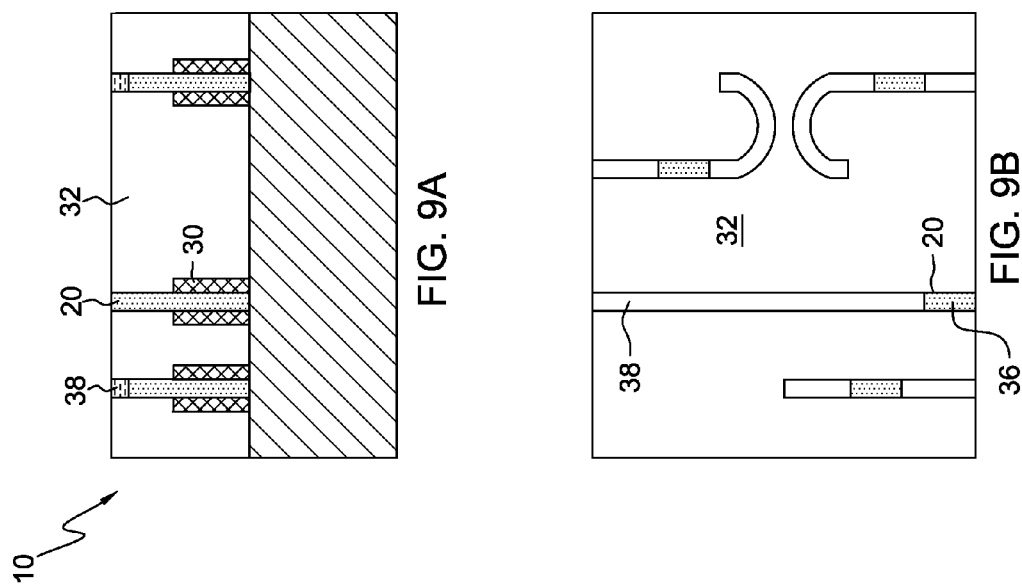

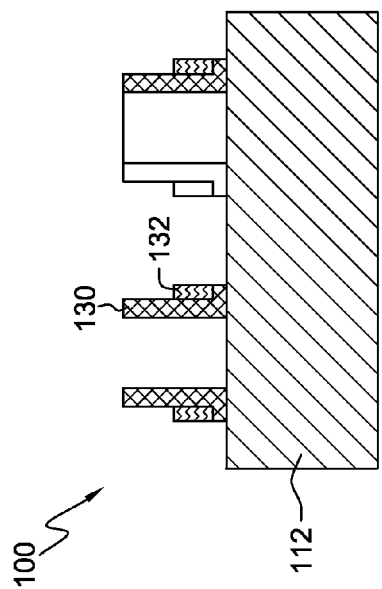
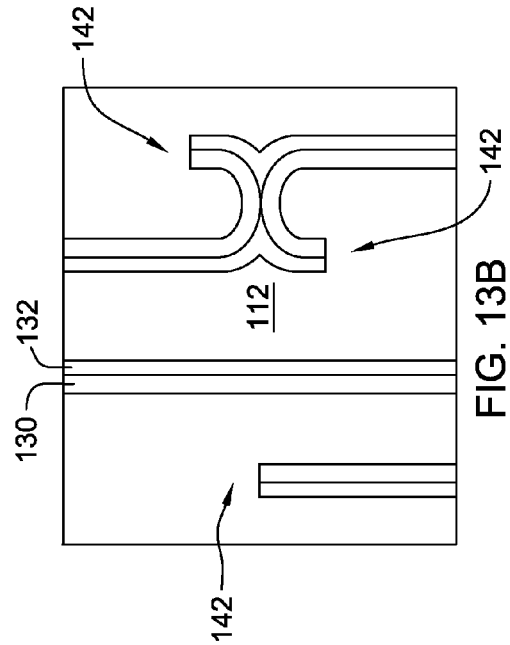
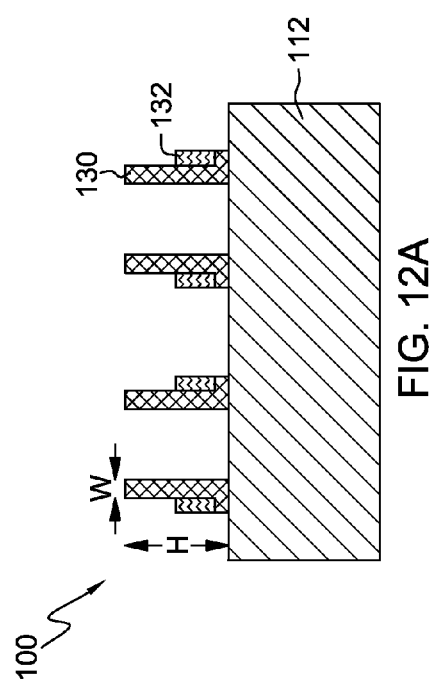
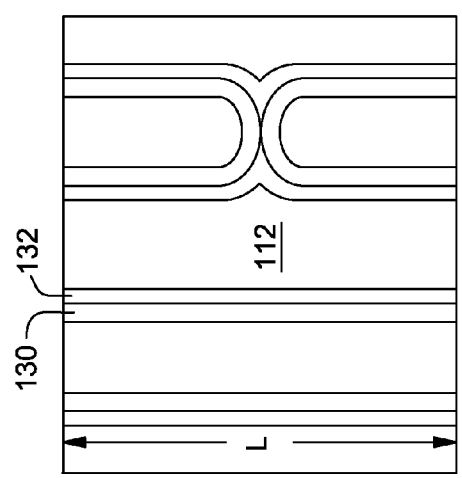

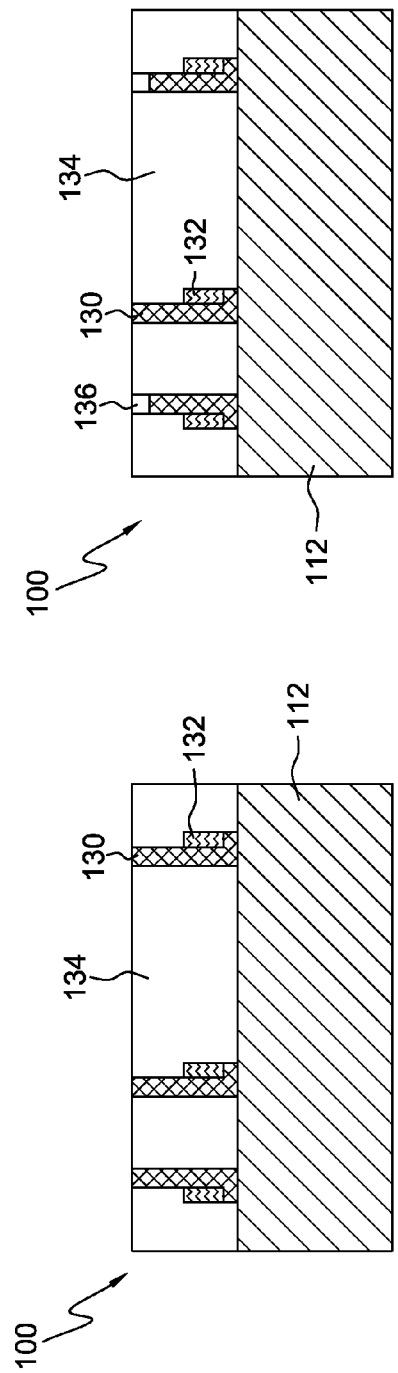
FIG. 14A
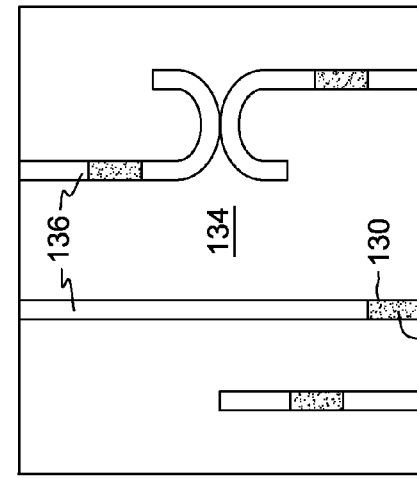
FIG. 15B
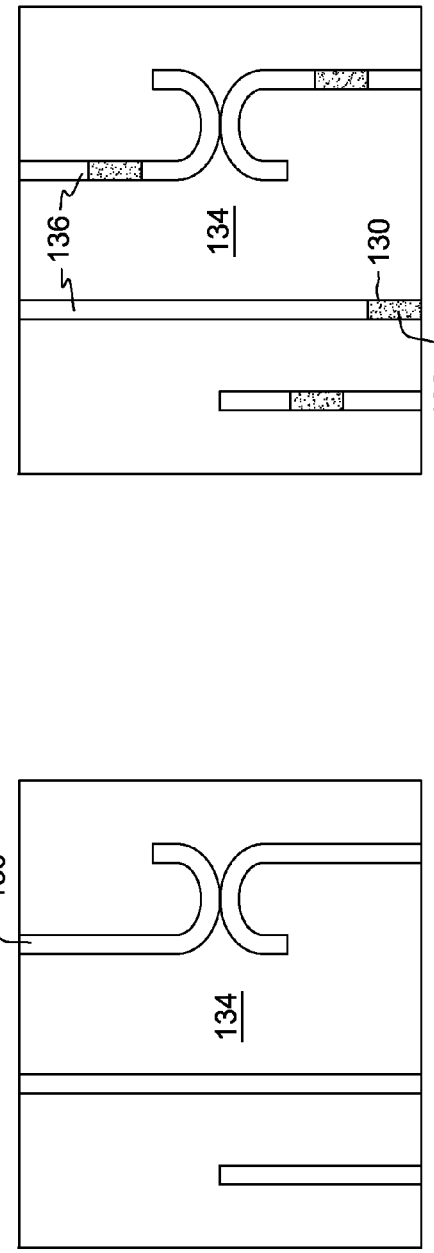
FIG. 14B
FIG. 15A

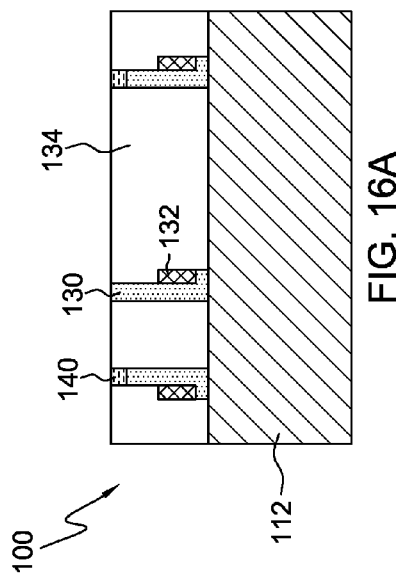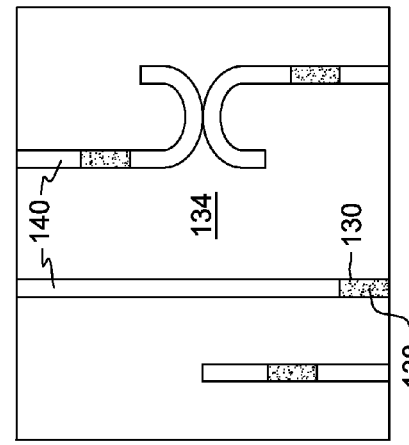

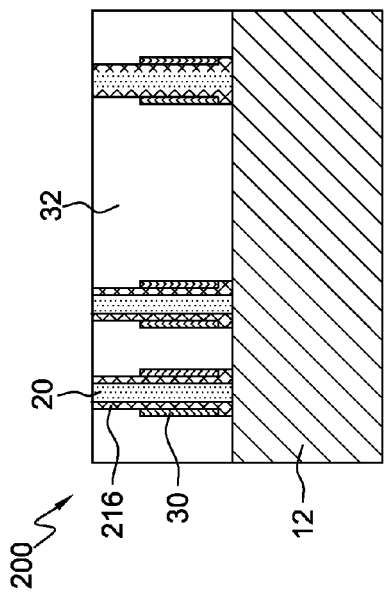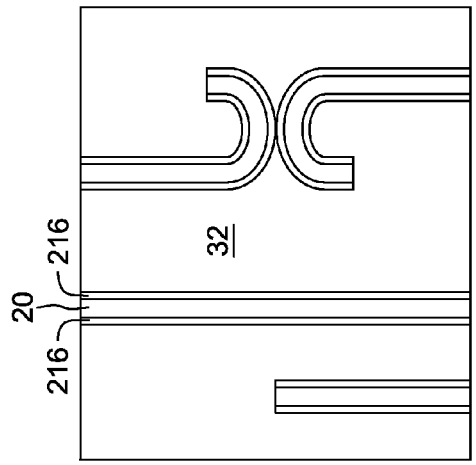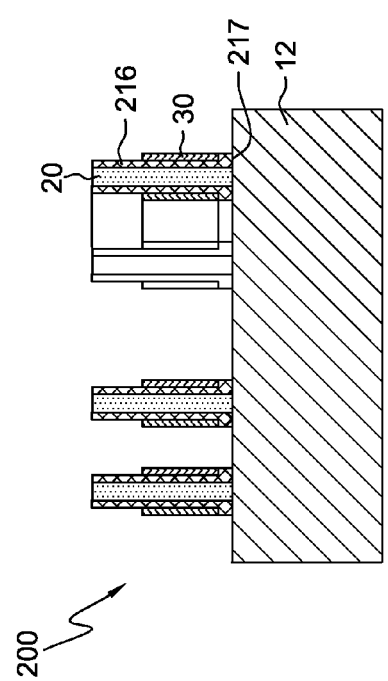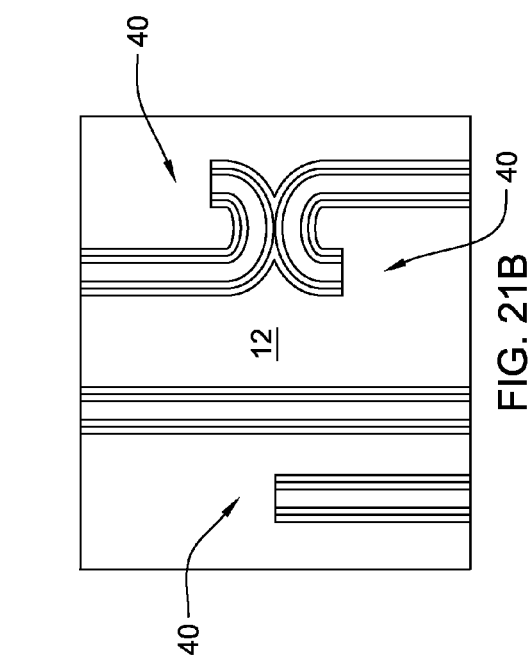

DUAL-METAL SELF-ALIGNED WIRES AND VIAS

BACKGROUND

The present invention relates to wiring in semiconductor structures and, more particularly, relates to dual-metal self-aligned wires and vias.

Current practice in back end of the wiring processing is to use self-aligned schemes, where metal troughs are defined in an interlayer dielectric layer or in a hard mask, and vias are printed and etched in such a way that only the union of the metal trough and the via shape form vias down to the previous metal wiring level. Reliable printing of small vias, however, is a major issue, so current practice is to design a bar shape to increase areal pattern printability, and where this bar crosses the union with the metal trough is the resulting via. However, if this bar overlaps onto an adjacent metal trough, then that union will result in an undesirable via and possibly short that adjacent line to underlying wires.

BRIEF SUMMARY

The various advantages and purposes of the exemplary embodiments as described above and hereafter are achieved by providing, according to a first aspect of the exemplary embodiments, a method of forming a semiconductor structure including: forming first conductive spacers on a semiconductor substrate; forming second conductive spacers with respect to the first conductive spacers, at least one of the second conductive spacers adjacent to and in contact with each of the first conductive spacers to form combined conductive spacers; recessing the second conductive spacers with respect to the first conductive spacers so that the first conductive spacers extend beyond the second conductive spacers; depositing an interlayer dielectric (ILD) to cover the first and second spacers except for an exposed edge of the first conductive spacers; patterning the exposed edges of the first conductive spacers to recess the edges of the first conductive spacers in predetermined locations to form recesses with respect to the ILD and unrecessed edges with respect to the ILD; and filling the recesses with an insulating material to leave the unrecessed edges of the first conductive spacers as vias to subsequent wiring features.

According to a second aspect of the exemplary embodiments, there is provided a method of forming a semiconductor structure including: forming mandrels on a semiconductor substrate; depositing a first conductive layer on the mandrels so as to cover the mandrels; depositing a second conductive layer over the first conductive layer; removing a portion of the second conductive layer and a portion of the first conductive layer to form first conductive spacers comprising the first conductive layer and second conductive spacers comprising the second conductive layer, at least one of the second conductive spacers adjacent to and in contact with each of the first conductive spacers to form combined conductive spacers; depositing an interlayer dielectric (ILD) to cover the first and second spacers except for exposed edges of the first conductive spacers; patterning the exposed edges of the combined conductive spacers to recess the edges of the combined conductive spacers in predetermined locations to form recesses with respect to the ILD and unrecessed edges with respect to the ILD; and filling the recesses with an insulating material to leave the unrecessed edges of the first conductive spacers as vias to subsequent wiring features.

According to a third aspect of the exemplary embodiments, there is provided a semiconductor structure including: a semiconductor substrate; a wiring layer on the semiconductor substrate, the wiring layer including: a plurality of fin-like structures and having a height (H), width (W) and length (L) such that L>H>W, each of the fin-like structures comprising a first layer of a first metal and a second layer of a second metal wherein the first metal is different from the second metal; and an interlayer dielectric (ILD) covering the plurality of fin-like structures except for exposed edges of the plurality of fin-like structures at predetermined locations as vias to subsequent wiring features.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1A to 9A and 1B to 9B illustrate a first method of practicing the exemplary embodiments.

FIGS. 10A to 16A and 10B to 16B illustrate a second method of practicing the exemplary embodiments.

FIGS. 17A to 24A and 17B to 24B illustrate a third method of practicing the exemplary embodiments.

DETAILED DESCRIPTION

Figure 3A:
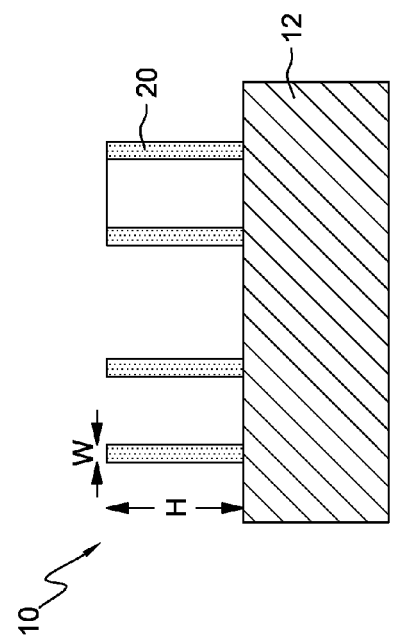

The problem with prior art wiring schemes is the difficulty in forming small-pitch metal wiring and necessary interlevel vias. The present inventors propose making wiring levels using two dissimilar metals, where the metals are formed in such a way that one metal is formed adjacent to one or two layers of the other metal, and only that one metal layer is used as a "stud-up" via to the next level. That one metal (via) is self-aligned to the metal line in the width direction, and forms only a portion of the total line width. The mask employed to define the position of that via can thus overlap the other-metal portion of adjacent lines without resulting in parasitic vias.

Referring to the Figures in more detail, and particularly referring to FIGS. 1A to 9A and 1B to 9B, there is illustrated a first method for practicing the exemplary embodiments. In the Figures, the "A" Figures illustrate cross-sectional views taken in the direction of arrows A-A shown in FIG. 1B, and the "B" Figures illustrate plan views.

FIGS. 1A and 1B illustrate a semiconductor structure 10 including a semiconductor substrate 12 having a plurality of mandrels 14 situated thereon. While only two mandrels 14 are shown, it should be understood that there will be many more such mandrels as these mandrels will form the basis for forming wiring lines. The mandrels 14 may be formed by depositing a layer of a sacrificial material such as silicon dioxide or carbon-doped oxide and then defining the mandrels 14 by a conventional photoresist process and reactive ion etching (RIE) such as by use of fluorine-containing plasmas, such as $CF_4$, $CHF_3$, and $C_4F_6$. After the mandrels 14 are defined, the photoresist may be stripped. An advantage of the exemplary embodiments is that the mandrels 14 may be conventionally defined since the pitch of the mandrels 14 is about twice the pitch of the wiring to be subsequently defined. The mandrels 14 may have a nominal width of 50-200 nm and height of 60-200 nm.

Semiconductor substrate 12 may be a bulk semiconductor or semiconductor on insulator substrate that has proceeded through front end of the line processing including forming transistors and vias and contacts with respect to these transistors. Semiconductor substrate 12 may also have one or more metal wiring levels (i.e., middle of the line or back end of the line wiring levels) before processing by the exemplary embodiments. Contacts or vias connecting to conductive structures within semiconductor substrate 12 intersect the top surface of semiconductor substrate 12. These contacts or vias may make contact with the wiring layer to be built on semiconductor substrate 12 as described hereafter.

Referring now to FIGS. 2A and 2B, a first metal layer 16 is deposited, preferably conformally deposited, over the mandrels 14 and the semiconductor substrate 12. The first metal layer 16 may be conventionally deposited by a process such as chemical vapor deposition. The thickness of the first metal layer 16 may be approximately one half to one quarter the desired final wire width, such as between 10 and 40 nm for current technologies. It is preferred that the first metal in first metal layer 16 is tungsten.

Figure 3B:
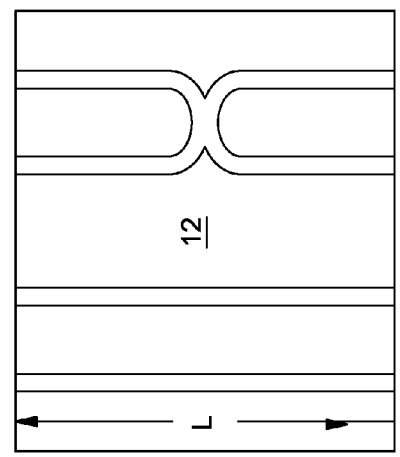

The semiconductor structure 10 may undergo a RIE process, indicated by arrows 18 in FIG. 2A, to remove horizontal portions of first metal layer 16 to expose mandrels 14 but leave spacers of first metal on the sidewalls of mandrels 14. The RIE process may be a process employing chlorine. The mandrels 14 may then be etched to remove them. If the mandrels 14 are silicon dioxide, they may be etched by hydrofluoric acid (HF) or buffered HF. If the mandrels 14 are carbon-doped oxide, the mandrels 14 may be etched by a RIE process such as fluorine plasmas or by chemical oxide removal as based on a mixture of ammonia and vapor-HF. The resulting structure is shown in FIGS. 3A and 3B where the spacers of first metal wiring layer 16 form fin-like structures 20 which have a height "H", a width "W" and a length "L" usually such that L>H>W. That is, the fin-like structures 20 are tall and thin and have a length that is usually larger than the height of the fin-like structures 20. The fin-like structures 20 may hereafter be referred to as spacers 20.

Figure 4A:
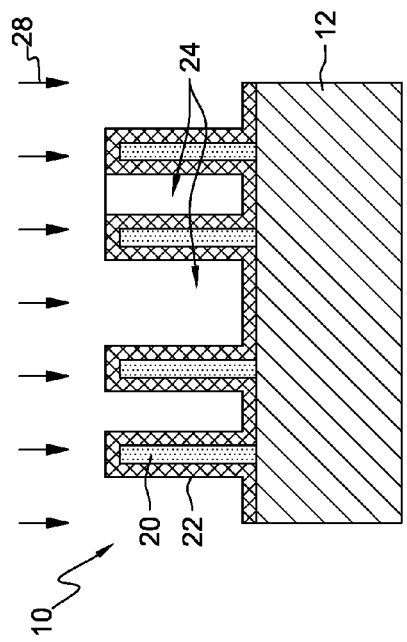
Figure 4B:
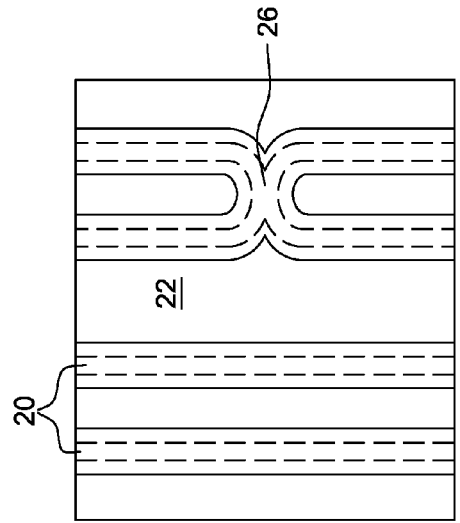

Referring now to FIGS. 4A and 4B, a second metal layer 22 is deposited, preferably conformally deposited, over the spacers 20 and the semiconductor substrate 12. The thickness of the second metal layer 22 may be approximately one eighth to one third of the desired final wire width, such as between 5 and 35 nm for current technologies, and in any event may be selected so as to not fill the spaces 24 between spacers 20 except where connections between adjacent lines is desired such as at location 26 shown in FIG. 4B. It should be understood that the spaces 24 between spacers 20 has been exaggerated for clarity in describing the exemplary embodiments. It is preferred that the second metal in the second metal layer 22 is aluminum.

Figure 5A:
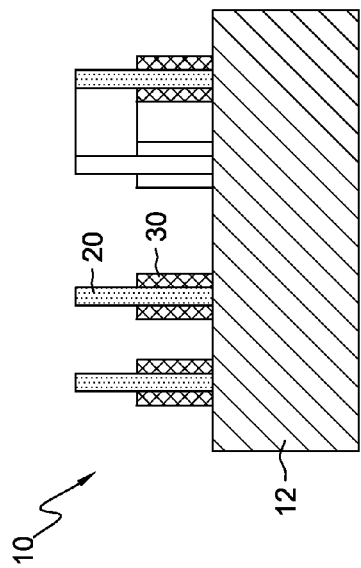
Figure 6A:
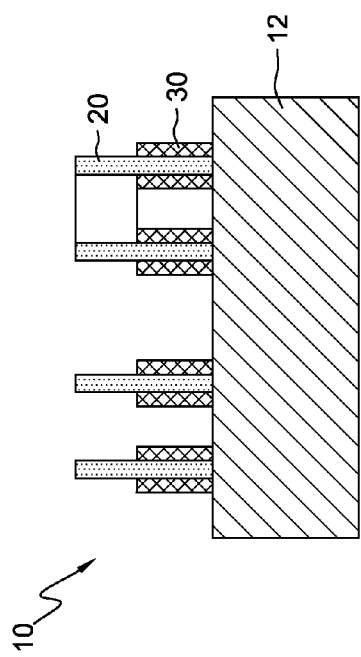
Figure 5B:
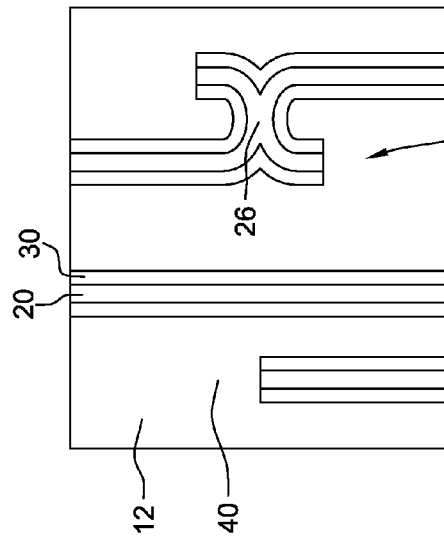
Figure 6B:
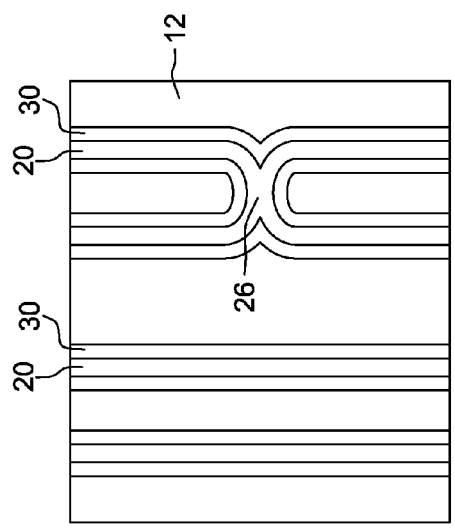
Figure 10A:
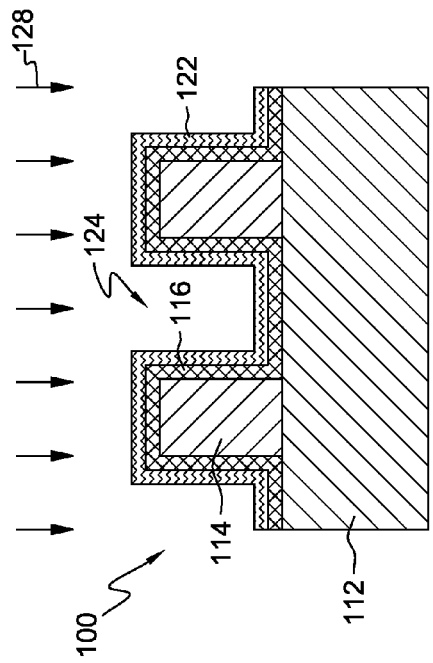

The semiconductor structure 10 may then undergo a RIE process, indicated by arrows 28 in FIG. 4A, to remove horizontal portions of second metal layer 22 to expose spacers 20 but leave spacers 30 of second metal on the sidewalls of spacers 20. The RIE process used may be $BCl_3$ removal of $Al_2O_3$ followed by low-power chlorine plasma. In this RIE process, indicated by arrows 28 in FIG. 4A, the second metal layer 22 is also recessed to lower the height of second metal layer 22. The resulting structure is shown in FIGS. 5A and 5B in which spacers 20 are "sandwiched" between shorter spacers 30. Spacers 20 extend beyond shorter spacers 30. Shorter spacers 30 are adjacent to and in physical contact with first spacers 20. Shorter spacers 30 are also on either side of first spacers 20 to form the "sandwich". Connection at location 26 between the second metal layer 22 (now second spacers 30) is preferably maintained.

The shorter spacers 30 provide an important advantage in that they form a wider line for greater conductivity and will be covered by an insulating material in a subsequent step. Interlayer wiring is conducted by the thinner first spacers 20. Narrow first spacers 20 form refractory via material self-aligned to the more-conductive second spacers 30, easing alignment of subsequent wire levels to vias from this level.

The first metal in spacers 20 and the second metal in spacers 30 should be selected such that they may be selectively etched by RIE or another process with respect to one another. Tungsten as the first metal and aluminum as the second metal meet this objective in that the aluminum spacers 30 may be etched with a chlorine-based RIE without adversely affecting the tungsten spacers 20.

The combination of first spacers 20 and second spacers 30 will form wiring lines in the finished structure. It may be desirable to selectively remove portions of first spacers 20 and second spacers 30 to form these wiring lines. After applying a suitable photoresist and patterning, the unwanted portions of first spacers 20 and second spacers 30 may be selectively removed at 40 to result in the structure shown in FIGS. 6A and 6B. In one etching process, a two-step etching process may be employed wherein the first spacers 20 (if tungsten) may be etched by the fluorine-based RIE process described above while the second spacers 30 (if aluminum) may be etched by the chlorine-based RIE process described above. The order of etching of the first spacers 20 and second spacers 30 may be reversed.

Referring now to FIGS. 7A and 7B, an interlayer dielectric (ILD) layer 32 is applied and planarized to reveal the top edges of first spacers 20. Sufficient ILD layer 32 must be maintained to avoid exposing second spacers 30. As shown in FIGS. 7A and 7B, only the top edges of first spacers 20 are exposed. ILD layer 32 may consist of Carbon-doped oxide (CDO). ILD layer 32 may also consist of a combination of CDO preceeded by deposition of a thin barrier material to better isolate the first spacers 20 and second spacers 30 from the bulk of ILD layer 32.

Then, vias are defined using photoresist applied to ILD layer 32 which is patterned using available lithography and etched using RIE to pull down (recess) the first conductive spacers 20 except where it is desired for the first conductive spacers 20 to form vias to the next metal wiring level. The RIE process utilized may be the fluorine-based process described above for etching the first spacers 20. FIGS. 8A and 8B illustrate where first spacers 20 have been recessed 34 to leave only portions 36 of first spacers 20 which form the vias to the next wiring level. The first spacers 20 must be recessed sufficiently so that when the recesses 34 are filled with an insulating material, the first spacers 20, except for portions 36, will be insulated from the next wiring level.

FIGS. 9A and 9B illustrate the deposition and planarization of insulating material 38 to fill the recesses 34 shown in FIGS. 8A and 8B. The insulating material 38 must be planarized sufficiently so that portions 36 of first spacers 20 are exposed. The insulating material 38 may be any insulating material that is capable of filling the recesses 34. Such insulating materials 38 may be silicon dioxide, carbon-doped oxide, polyimides, or polynorbornenes.

Further processing may then continue to form a second wiring level (not shown) according to processing illustrated in FIGS. 1A to 9A and 1B to 9B or by conventional processing.

Referring now to FIGS. 10A to 16A and 10B to 16B, there is illustrated a second method for practicing the exemplary embodiments. In the Figures, the "A" Figures illustrate cross-sectional views taken in the direction of arrows A-A shown in FIG. 10B, and the "B" Figures illustrate plan views.

The second method begins with the same semiconductor structure 100 including a semiconductor substrate 112 having a plurality of mandrels 114 situated thereon as previously illustrated and described with respect to FIGS. 1A and 1B.

Figure 11A:
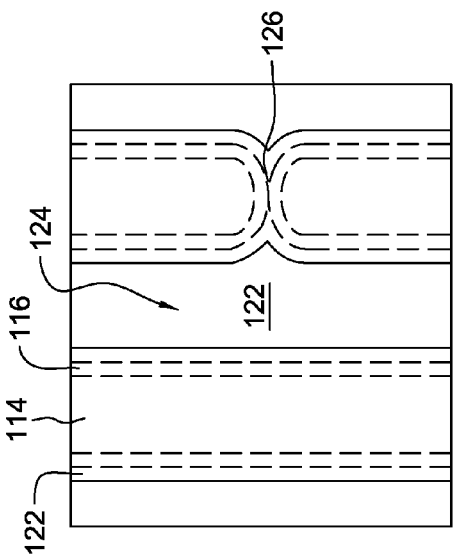
Figure 10B:
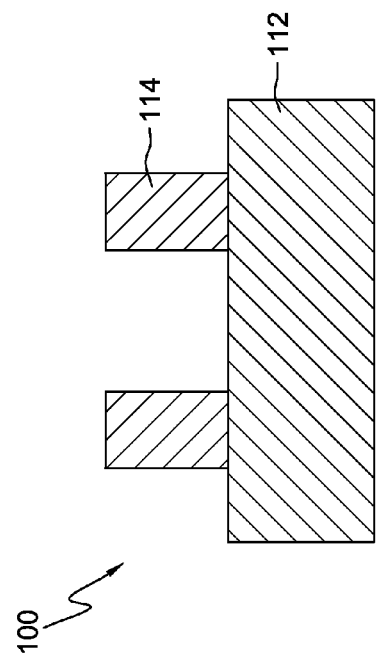
Figure 11B:
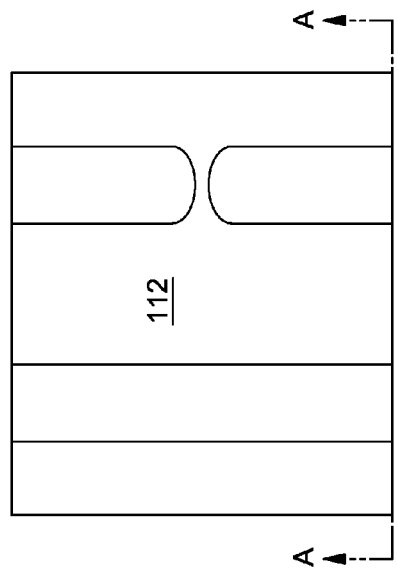

Referring now to FIGS. 11A and 11B, a first metal layer 116 is deposited, preferably conformally deposited, over the mandrels 114 and the semiconductor substrate 12. The thickness of the first metal layer 16 is approximately one half to one third the desired final wire width, such as between 10 and 40 nanometers. It is preferred that the first metal in first metal layer 116 is tungsten. Then, a second metal layer 122 is deposited, preferably conformally deposited, over the first metal layer 116. The thickness of the second metal layer 122 is approximately one half to two thirds of the desired final wire width, such as between 15 to 40 nanometers and in any event may be selected so as to not fill the spaces 124 between mandrels 114 except where connection between adjacent lines is desired such as at location 126 shown in FIG. 11B. It should be understood that the spaces 124 between mandrels 114 has been exaggerated for clarity in describing the exemplary embodiments. It is preferred that the second metal in the second metal layer 122 is aluminum.

The semiconductor structure 100 undergoes a RIE process, indicated by arrows 128 in FIG. 11A, to remove horizontal portions of second metal layer 122 and first metal layer 116 to expose mandrels 114. The RIE process may include a two-step RIE process in which a chlorine-based RIE (described above) may be utilized to etch the second metal layer 122 to form spacers 132 of second metal on sidewalls of first metal 116, and a fluorine-based RIE (described above) may be utilized to etch the first metal layer 116 to form spacers 130 of first metal on sidewalls of mandrels 114. The second metal layer 122 may be etched to recess the spacers 132 below the top of the first metal layer 116. The mandrels 114 may then be etched by HF, buffered HF or RIE, as described in the first exemplary embodiment, to remove them. The resulting structure is shown in FIGS. 12A and 12B where the remnants of first metal wiring layer 116 form fin-like structures 130 which have a height "H", a width "W" and a length "L" usually such that L>H>W. That is, the fin-like structures 130 are tall and thin and have a length that is usually larger than the height of the fin-like structures 130. The fin-like structures 130 will hereafter be referred to as first spacers 130. Adjacent to and in physical contact with the first spacers 130 are second spacers 132 which are the remnants of second metal layer 122.

In an alternative embodiment, the mandrels 114 may remain in place and need not be etched away if they are made of appropriate insulators, such as carbon-doped oxides or $SiO_2$.

It is noted that in the semiconductor structure 100 illustrated in FIGS. 12A and 12B, the second spacers 132 are only on one side of the first spacers 130. An advantage of the second exemplary method is that fewer processing steps may be required and second spacers 132 provide physical support to first spacers 130 after removal of the mandrels 114. Connection at location 126 between the second metal layer 122 (now second spacers 132) is preferably maintained.

The combination of first spacers 130 and second spacers 132 may form wiring lines in the finished structure. It may be desirable to selectively remove portions of first spacers 130 and second spacers 132 to form these wiring lines. After applying a suitable photoresist and patterning, the unwanted first spacers 130 and second spacers 132 may be selectively removed at 142 by etching to result in the structure shown in FIGS. 13A and 13B. In one etching process, a two-step etching process may be employed wherein the second spacers 132 (if aluminum) may be etched by the chlorine-based RIE process described above and the first spacers 130 (if tungsten) may be etched by the fluorine-based RIE process described above.

Referring now to FIGS. 14A and 14B, an interlayer dielectric (ILD) layer 134 is applied and planarized to reveal the top edges of first spacers 130. Sufficient ILD layer 134 must be maintained to avoid exposing second spacers 132. As shown in FIGS. 14A and 14B, only the top edges of first spacers 130 are exposed.

Then, ILD layer 134 is masked with a photoresist and the first spacers 130 are etched using a fluorine-based RIE as previously described to pull down (recess) the first spacers 130 except where it is desired for the first spacers 130 to connect as vias to the next metal wiring level. FIGS. 15A and 15B illustrate where first spacers 130 have been recessed 136 to leave only portions 138 of first spacers 130 which will contact as vias to the next metal wiring level. The first spacers 130 must be recessed sufficiently so that when the recesses 136 are filled with an insulating material, the first spacers 130, except for portions 138, will be insulated from the next wiring level.

FIGS. 16A and 16B illustrate the deposition and planarization of insulating material 140 to fill the recesses 136 shown in FIGS. 15A and 15B. The insulating material 140 must be planarized sufficiently so that portions 138 of first spacers 130 are exposed. The insulating material may be, for example, silicon dioxide, carbon-doped oxide or SiLK.

Further processing may then continue to form a second wiring level (not shown) according to processing illustrated in FIGS. 1A to 9A and 1B to 9B, FIGS. 10A to 16A and 10B to 16B, or by conventional processing.

Referring now to FIGS. 17A to 24A and 17B to 24B, there is illustrated a third method for practicing the exemplary embodiments. In the Figures, the "A" Figures illustrate cross-sectional views taken in the direction of arrows A-A shown in FIG. 17B, and the "B" Figures illustrate plan views.

The third method begins with the same semiconductor structure including a semiconductor substrate 12 having a plurality of first spacers 20 situated thereon as previously illustrated and described with respect to FIGS. 1A to 3A and 1B to 3B. In the third exemplary embodiment, it is desired to place a thin layer of material, in this case another layer of first metal, between the second metal layer to be deposited and substrate 12.

Figure 18A:
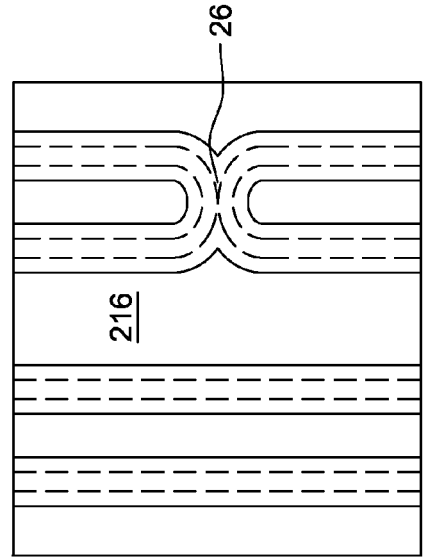
Figure 18B:
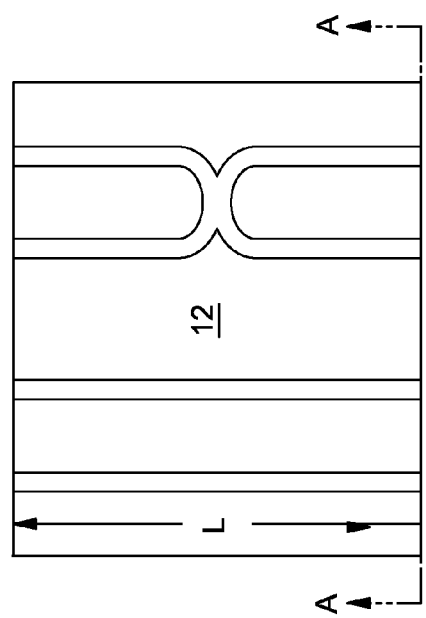
Figure 17A:
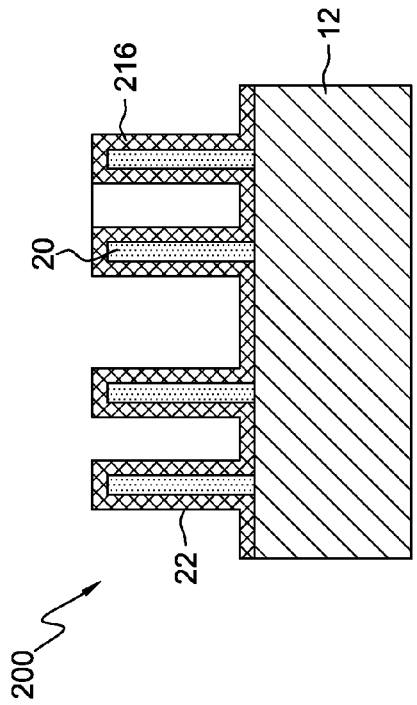
Figure 17B:
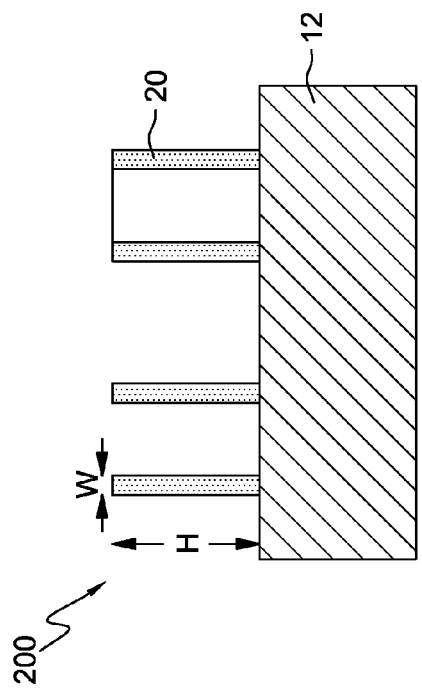

Referring now to FIGS. 18A and 18B, a second layer of first metal 216 is deposited, preferably conformally, over first spacers 20. The thickness of second layer of first metal 216 is desired to be between 3 and 6 nm, although other thicknesses sufficient to prevent interaction between second metal layer 222 (deposited hereafter) and substrate 12 can be employed.

Figure 19A:
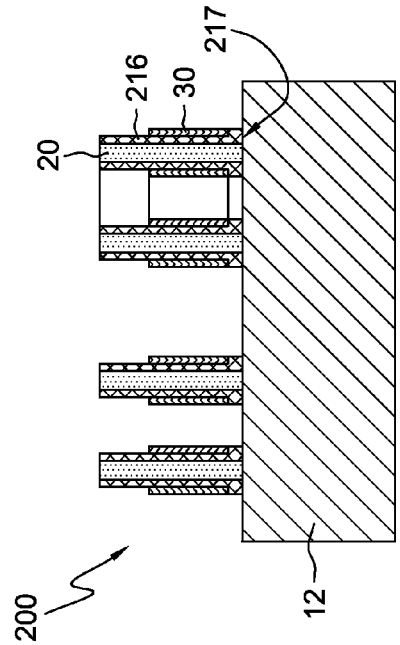
Figure 19B:
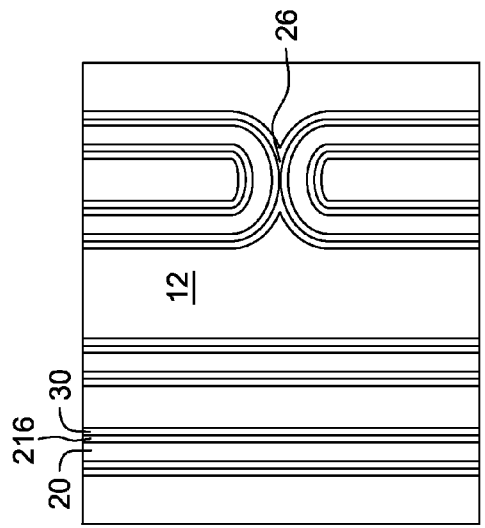

Thereafter, as shown in FIGS. 19A and 19B, second metal layer 222 is deposited, preferably conformally, over second layer of first metal 216. As discussed with respect to the first exemplary embodiment, the first metal in first spacers 20 and second layer of first metal 216 may be tungsten while the second metal in second metal layer 222 may be aluminum. The semiconductor structure 200 then undergoes a multiple step RIE process 228 which includes first employing a chlorine-based RIE to remove horizontal portions of second metal layer 222 and recess second metal layer 222 to form second spacers 30. In a next step, a fluorine-based RIE is employed to remove horizontal portions of second layer of first metal 216.

Figure 20A:
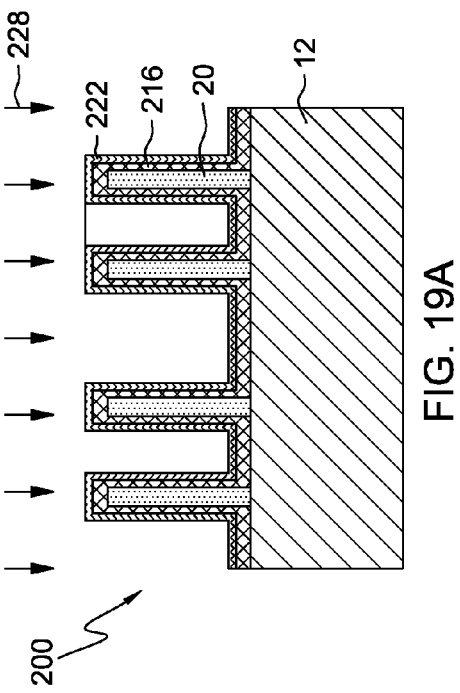
Figure 20B:
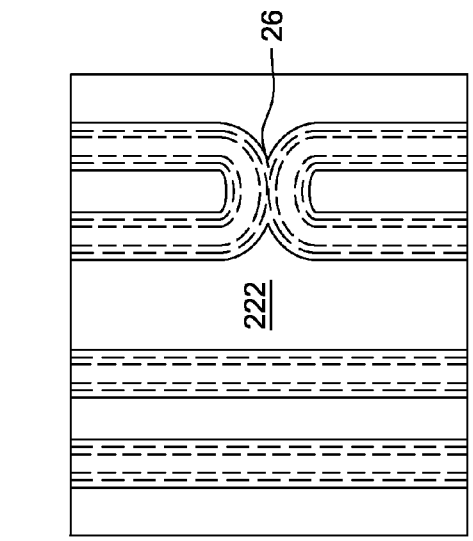

The result is shown in FIGS. 20A and 20B. It is noted that a portion 217 of second layer of first metal layer 216 is situated underneath second spacer 30 to isolate second spacer 30 from physical contact with substrate 12.

Further processing of semiconductor structure 200 may continue as described with respect to the first exemplary embodiment.

That is, wiring lines that are formed by the combination of first spacers 20 and second spacers 30 may be selectively removed as illustrated in FIGS. 21A and 21B and as described above.

Then, an interlayer dielectric (ILD) layer 32 is applied and planarized to reveal the top edges of first spacers 20 and second layer of first metal 216 as shown in FIGS. 22A and 22B. Only the top edges of first spacers 20 are exposed.

Figure 23A:
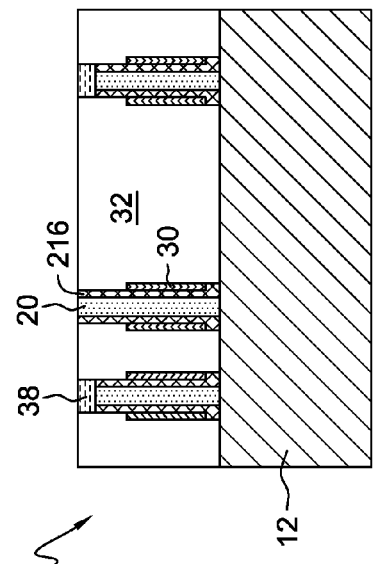
Figure 23B:
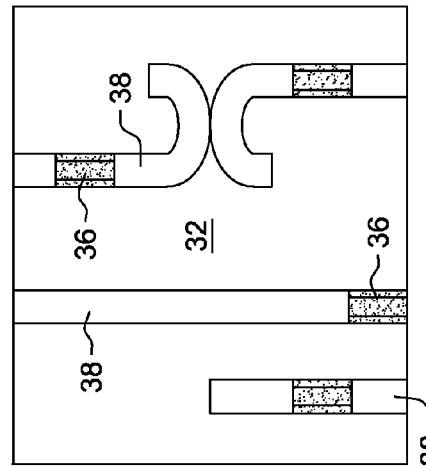

Then, as shown in FIGS. 23A and 23B, recesses 34 are formed in ILD layer 32 to leave only portions 36 of first spacers 20 and second layer of first metal 216 which constitute the vias to the next metal wiring level.

Figure 24A:
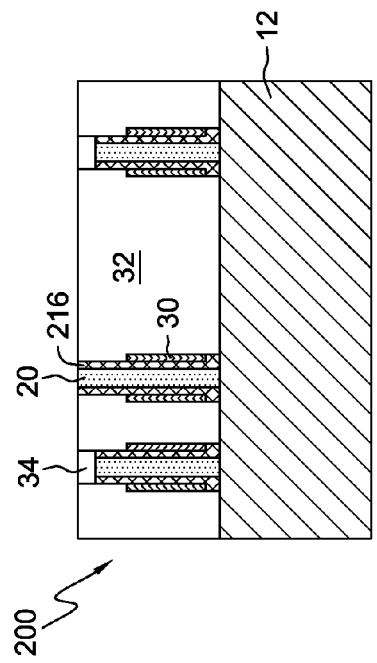
Figure 24B:
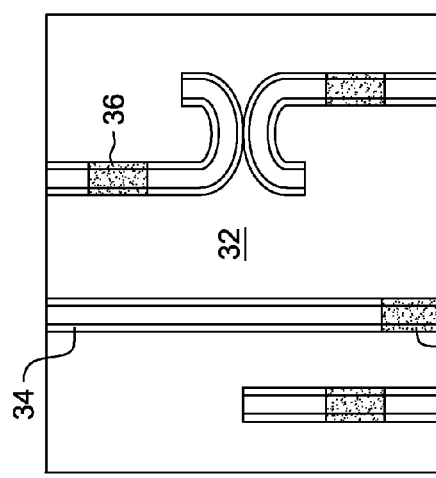

FIGS. 24A and 24B illustrate the deposition and planarization of insulating material 38 to fill the recesses 34 shown in FIGS. 23A and 23B.

Further processing may then continue to form a second wiring level (not shown) according to processing illustrated in FIGS. 1A to 9A and 1B to 9B, FIGS. 10A to 16A and 10B to 16B, FIGS. 17A to 24A and 17B to 24B, or by conventional processing.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of forming a semiconductor structure comprising:
   forming first conductive spacers on a semiconductor substrate;
   forming second conductive spacers with respect to the first conductive spacers, at least one of the second conductive spacers adjacent to and in contact with each of the first conductive spacers to form combined conductive spacers;
   recessing the second conductive spacers with respect to the first conductive spacers so that the first conductive spacers extend beyond the second conductive spacers;
   depositing an interlayer dielectric (ILD) to cover the first and second spacers except for an exposed edge of the first conductive spacers;
   patterning the exposed edges of the first conductive spacers to recess the edges of the first conductive spacers in predetermined locations to form recesses with respect to the ILD and unrecessed edges with respect to the ILD; and
   filling the recesses with an insulating material to leave the un-recessed edges of the first conductive spacers as vias to subsequent wiring features.

2. The method of claim 1 wherein the first conductive spacer comprises a first metal and the second conductive spacer comprises a second metal such that the first metal is different from the second metal.

3. The method of claim 2 wherein the first metal is tungsten and the second metal is aluminum.

4. The method of claim 1 further comprising forming a portion of the first conductive spacers to extend underneath the second conductive spacers so as to insulate the second conductive spacers from physical contact with the semiconductor substrate.

5. The method of claim 1 wherein the first and second conductive spacers are fin-like structures having a height (H), width (W) and length (L) such that L>H>W.

6. The method of claim 1 wherein in the step of forming second conductive spacers includes forming a second conductive spacer adjacent to and in contact with each of the first conductive spacers.

7. A method of forming a semiconductor structure comprising:
   forming mandrels on a semiconductor substrate;
   depositing a first conductive layer on the mandrels so as to cover the mandrels;
   depositing a second conductive layer over the first conductive layer;
   removing a portion of the second conductive layer and a portion of the first conductive layer to form first conductive spacers comprising the first conductive layer and second conductive spacers comprising the second conductive layer, at least one of the second conductive spacers adjacent to and in contact with each of the first conductive spacers to form combined conductive spacers;
   forming an interlayer dielectric (ILD) to cover the first and second spacers except for exposed edges of the first conductive spacers;
   patterning the exposed edges of the combined conductive spacers to recess the edges of the combined conductive spacers in predetermined locations to form recesses with respect to the ILD and unrecessed edges with respect to the ILD; and
   filling the recesses with an insulating material to leave the un-recessed edges of the first conductive spacers as vias to subsequent wiring features.

8. The method of claim 7 further comprising removing the mandrels and comprising, in the following order, depositing the first conductive layer, removing the portion of the first conductive layer, removing the mandrels, depositing the second conductive layer, removing the portion of the second conductive layer such that there are two second conductive spacers formed adjacent to and in contact with each of the first conductive spacers, forming the ILD, patterning the exposed edges and filling the recesses.

9. The method of claim 7 further comprising removing the mandrels before depositing the second conductive layer and further comprising depositing a second layer of the first conductive layer followed by depositing the second conductive layer and removing the portion of the second conductive layer so that after removing the portion of the second conductive layer, there remains a portion of the first conductive layer underneath the second conductive layer.

10. The method of claim 7 further comprising removing the mandrels and wherein removing a portion of the second conductive layer, a portion of the first conductive layer and removing the mandrels comprises, in the following order, removing a portion of the second conductive layer, removing a portion of the first conductive layer and removing the mandrels such that there is only one second conductive spacer formed adjacent to an in contact with each of the first conductive spacers.

11. The method of claim 7 further comprising recessing the second conductive spacers with respect to the first conductive spacers so that the first conductive spacers extend beyond the second conductive spacers and the exposed edges of the combined conductive spacers are the edges of the first conductive spacers.

12. The method of claim 7 wherein after removing a portion of the second conductive layer, a portion of the first conductive layer further comprising removing predetermined portions of the combined conductive spacers.

13. The method of claim 7 wherein the first conductive spacer comprises a first metal and the second conductive spacer comprises a second metal such that the first metal is different from the second metal.

14. The method of claim 7 wherein the first metal is tungsten and the second metal is aluminum.

15. The method of claim 7 wherein the first and second conductive spacers are fin-like structures having a height (H), width (W) and length (L) such that L>H>W.

16. The method of claim 11 wherein after depositing the ILD, further comprising planarizing the ILD to expose the edges of the first conductive spacers.

17. The method of claim 7 wherein after filling the recesses, planarizing the insulation material.

18. The method of claim 7 further comprising repeating all steps to form a second wiring layer on the first wiring layer.

* * * * *